(12) United States Patent
Hong

(10) Patent No.: US 8,208,328 B2
(45) Date of Patent: Jun. 26, 2012

(54) SEMICONDUCTOR MEMORY DEVICE

(75) Inventor: Sang Pyo Hong, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 196 days.

(21) Appl. No.: 12/815,621

(22) Filed: Jun. 15, 2010

(65) Prior Publication Data

US 2010/0315893 A1    Dec. 16, 2010

(30) Foreign Application Priority Data

Jun. 15, 2009    (KR) .................. 10-2009-0052750

(51) Int. Cl.
*G11C 7/00* (2006.01)
(52) U.S. Cl. .................. 365/203; 365/189.11; 365/206
(58) Field of Classification Search .................. 365/203, 365/189.11, 206, 207
See application file for complete search history.

(56) References Cited

U.S. PATENT DOCUMENTS

| 6,937,535 B2 * | 8/2005 | Ahn et al. ............... 365/222 |
| 7,158,428 B2 * | 1/2007 | Fujimoto ............... 365/203 |

FOREIGN PATENT DOCUMENTS

| JP | 04134693 A | 5/1992 |
| JP | 2000195268 A | 7/2000 |
| KR | 1020030026010 A | 3/2003 |
| KR | 1020040038449 A | 5/2004 |

* cited by examiner

*Primary Examiner* — Son Dinh
(74) *Attorney, Agent, or Firm* — Volentine & Whitt, PLLC

(57) ABSTRACT

A semiconductor memory device including a CMOS-type local sensing amplifier circuit is provided. The semiconductor memory device includes a first input/output (I/O) line pair, a second I/O line pair pre-charged to a one-half power voltage level and receives data from the first I/O line pair, and a pull-up circuit pulling up a voltage of one of the second I/O pair to a full power voltage level.

20 Claims, 10 Drawing Sheets

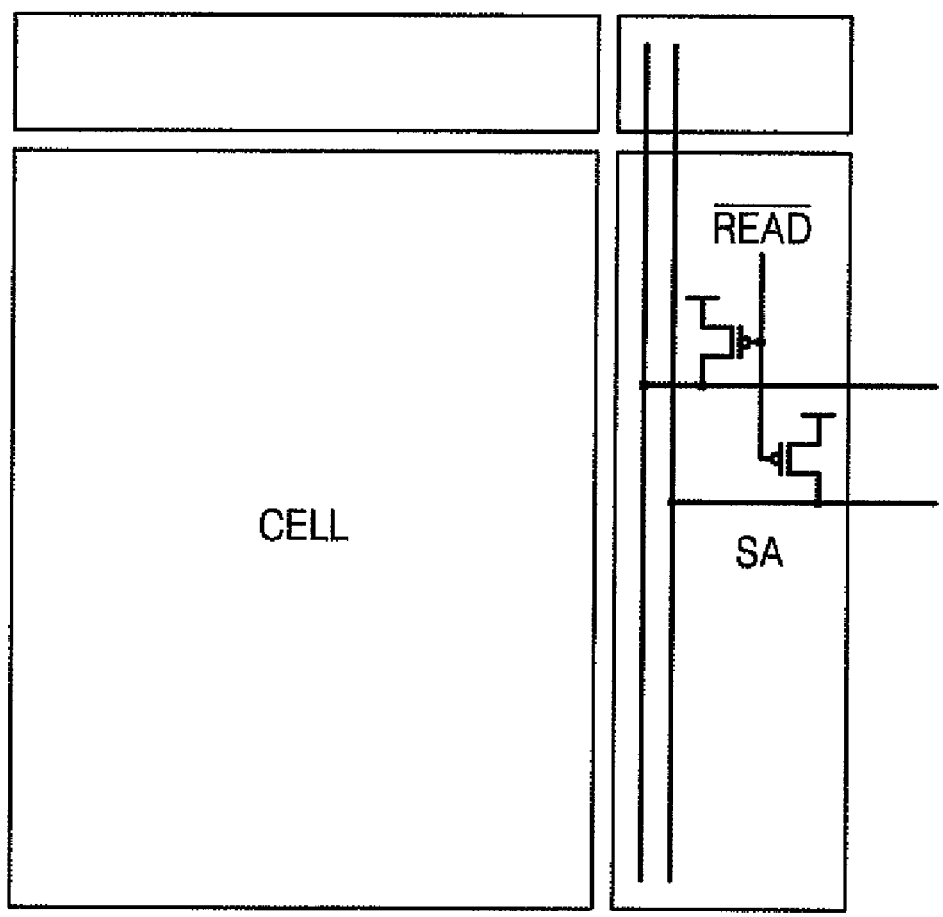

US 8,208,328 B2

SEMICONDUCTOR MEMORY DEVICE

CROSS-REFERENCE TO RELATED APPLICATIONS

This application claims priority under 35 U.S.C. §119 to Korean Patent Application No. 10-2009-0052750 filed on Jun. 15, 2009, the subject matter of which is hereby incorporated by reference.

BACKGROUND

The present inventive concept relates to semiconductor devices, and more particularly, to semiconductor memory devices capable of pulling-up one of a local line pair using a pull-up circuit.

As is conventionally understood, contemporary semiconductor memory devices use a sense amplifier circuit to sense data stored in each memory cell of a constituent memory cell array. Such semiconductor memory devices use certain circuits and techniques for equalizing the sense amplifier circuit to improve a data sensing speed.

Contemporary semiconductor memory devices typically have the ability to operate in a so-called "burst mode" that enables high speed data access operations (e.g., read operations).

Data access operations (e.g., write and read operations) are accomplished using a number of input/output (I/O) lines extending into the memory cell array. Given the size of many contemporary memory cell arrays, the I/O lines are hierarchically configured as local I/O lines or global I/O lines. In particular, assuming a semiconductor memory device having a stacked bank structure, the word lines and local data I/O line pairs are typically arranged in parallel while the local data I/O line pairs and global data I/O line pairs are typically arranged perpendicularly to one another.

In conventional semiconductor memory devices, all of the data access paths between bit line sensing amplifier circuits and I/O sensing amplifier circuits are pre-charged to the full-level of a power voltage. Unfortunately, this approach tends to increase write/read cycle times, and data sensing errors may arise due to impedance and/or voltage mismatch(es) related to the sense amplifier circuits.

SUMMARY

Embodiments of the inventive concept provide semiconductor memory devices capable of reducing the probability of data sensing errors due to the foregoing conditions.

One embodiment of the inventive concept is directed to a semiconductor memory device comprising; a first input/output (I/O) line pair, a second I/O line pair pre-charged to a one-half power voltage level and configured to receive data from the first I/O line pair, and a pull-up circuit configured to pull-up a voltage apparent on one of the second I/O line pair to a full power voltage level in response to a control signal.

Another embodiment of the inventive concept is directed to a semiconductor memory device comprising; a local line and a complementary local line, a global line connected to the local line and a complementary global line connected to the complementary local line, a first pre-charge circuit configured to pre-charge the local line and the complementary local line to a one-half power voltage level during a pre-charge operation, a second pre-charge circuit configured to pre-charge the global line and the complementary global line to the one-half power voltage level during the pre-charge operation, and a pull-up circuit configured to pull-up a voltage apparent on one of the local line and the complementary local line to a full power voltage level in response to a control signal.

Another embodiment of the inventive concept is directed to a method of operating a semiconductor memory device, comprising; respectively connecting bit lines of a bit line pair with local lines of a local line pair, precharging the local line pair to a one-half power voltage level, after pre-charge of the local line pair, communicating data from the bit line pair to the local line pair, using a local sensing amplifier, sensing/amplifying the data on the local line pair, precharging a global line pair connected to the local line pair to the one-half power voltage level, respectively connecting global lines of the global line pair with local lines of the local line pair and communicating the data to the global line pair, and thereafter pulling-down a voltage apparent on one global line of the global line pair while pulling-up a voltage apparent on the other global line of the global line pair, and using a global sensing amplifier, sense/amplifying the data on the global line pair.

BRIEF DESCRIPTION OF THE DRAWINGS

These and/or other aspects and advantages of the inventive concept will become apparent and more readily appreciated from the following description of the embodiments taken in conjunction with the accompanying drawings of which:

FIGS. 6A through 6D variously illustrate certain arrangement examples for the location of a pull-up circuit relative to a memory cell array layout according to embodiments of the inventive concept.

DETAILED DESCRIPTION OF EMBODIMENTS

Reference will now be made in some additional detail to embodiments of the inventive concept illustrated in the accompanying drawings. Throughout the written description and drawings, like reference numbers and labels are used to denote like or similar elements.

Figure 1:
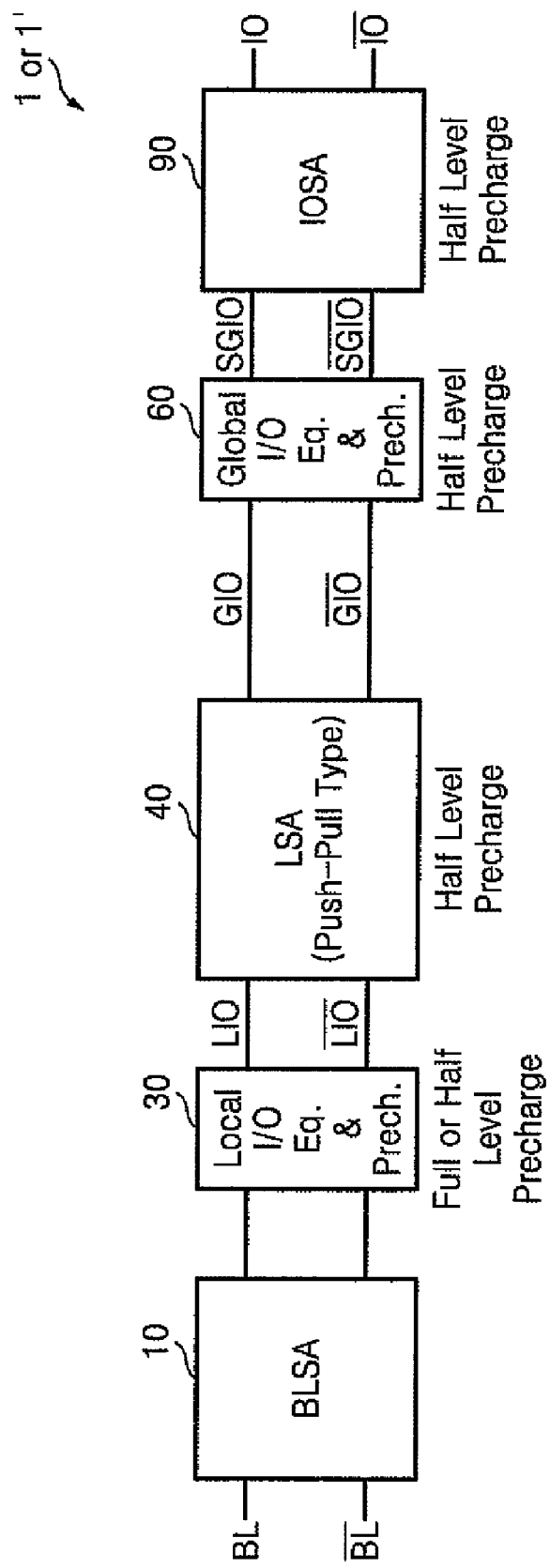
FIG. 1 is a schematic block diagram of a semiconductor memory device according to an embodiment of the inventive concept.

FIG. 1 is a schematic block diagram of a semiconductor memory device according to an embodiment of the inventive concept. The semiconductor memory device 1 or 1' comprises a bit line sensing amplifier circuit 10, a local sensing amplifier circuit 40 and an input/output (I/O) sensing amplifier circuit 90.

In addition, the semiconductor memory device 1 or 1' further comprises a local input/output (I/O) line pre-charge circuit or a local I/O line equalizer circuit 30 configured to equalize or pre-charging the local sensing amplifier circuit 40, and a global I/O line pre-charge circuit or a global I/O line equalizer circuit 60 configured to equalize or pre-charging the I/O sensing amplifier circuit 90.

Within the embodiment of FIG. 1, the plurality of sensing amplifier circuits 10, 40, and 90 are assumed to be latched type circuits, and exhibit ideal or near-ideal operating properties when the I/O sensing amplifier circuit 90 operates with one half the level of power voltage VDD (VDD/2). Of note, VDD is used as the assumed power voltage throughout the illustrated embodiments, but those skilled in the art will recognize that other power voltages, such as those commonly apparent in conventional semiconductor devices may be used within embodiments of the inventive concept.

By embodying the semiconductor memory device 1 or 1', such that that signal paths between the local sensing amplifier circuit 40 and the I/O sensing amplifier circuit 90 may be pre-charged with one-half VDD. In this manner, sensing efficiency for the I/O sensing amplifier circuit 90 may be maximized. Here, a local I/O line pre-charge circuit 30 may be pre-charged with the full level or the half level of VDD.

Figure 2:
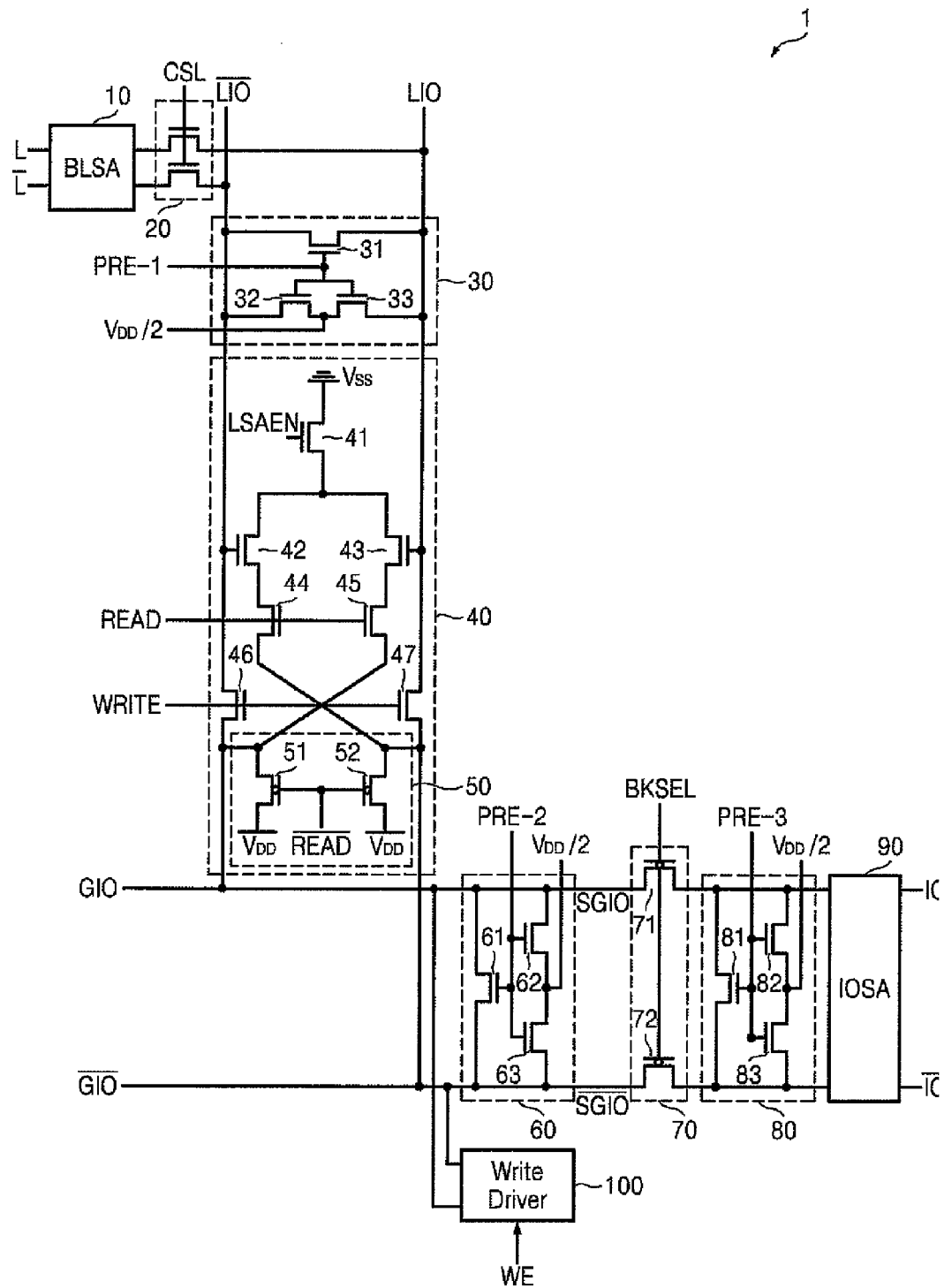
FIG. 2 is a circuit diagram further illustrating the semiconductor memory device of FIG. 1 according to one embodiment of the inventive concept.

FIG. 2 is a circuit diagram further illustrating the semiconductor memory device of FIG. 1 according to one embodiment of the inventive concept. Referring to FIGS. 1 and 2, the semiconductor memory device 1 is assumed to be a Dynamic Random Access Memory (DRAM) capable of controlling the input and output of data according to an embodiment of the inventive concept. However, those skilled in the art will recognize that other types of semiconductor memory devices may incorporate the circuits and operating techniques described herein.

A bit line pair BL and /BL is connected to a memory cell (not shown) and communicate data stored in the memory cell to the bit line sensing amplifier circuit 10. For example, when conventionally understood DRAM control signals (such as, e.g., /RAS, /CAS, write enable /WE, etc.) are properly applied to the semiconductor memory device 1, the semiconductor memory device 1 will provide voltage signal(s) indicating a defined data state (hereafter, "data") from the memory cell to the bit line pair BL and /BL in accordance with the applied control signals.

The bit line sensing amplifier circuit 10 senses and amplifies the data received from the memory cell through the bit line pair BL and /BL. Once sensed and amplified by the bit line sensing amplifier circuit 10, the data is communicated to a local data line pair LIO and /LIO (hereinafter termed a "local line pair").

Data communicated to the local line pair LIO and /LIO is then sensed and amplified a second time by the local sensing amplifier circuit 40, and further communicated to a global data line pair GIO and /GIO (hereinafter termed a "global line pair"). Data communicate to the global line pair GIO and /GIO is then sensed and amplified a third time by the I/O sensing amplifier circuit 90 before finally being provided to a data I/O line pair I/O and I/O.

Figure 3:
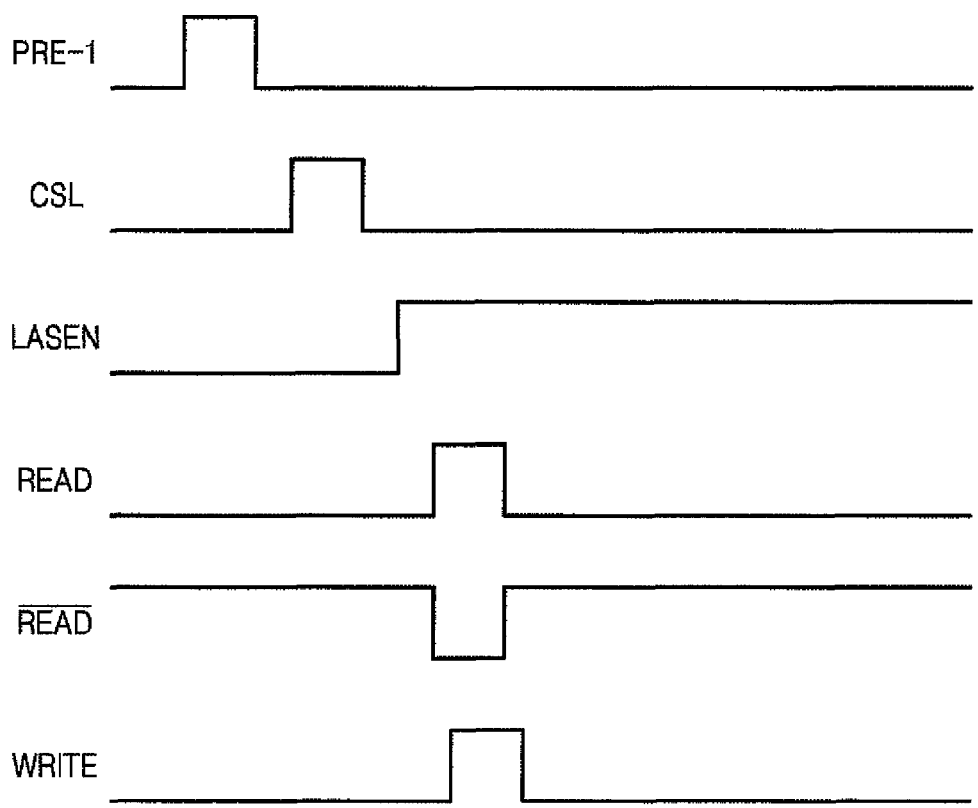
FIG. 3 is a timing diagram further illustrating the operation of the circuit diagram of FIG. 2.

The following explains one possible mode of operation for the semiconductor memory device 1. Reference is made to FIGS. 2 and 3. A column selection circuit 20 is disposed between the bit line sensing amplifier circuit 10 and a local line pair LIO and /LIO. The column selection circuit 20 essentially connects the bit line pair BL and /BL with the local line pair LIO and /LIO in response to a column selection signal CSL.

The local I/O line pre-charge circuit 30 is disposed in relation to the local line pair LIO and /LIO such that it may pre-charge the local line pair LIO and /LIO to one-half VDD in response to a first pre-charge control signal PRE-1.

As illustrated in FIG. 3, after the local line pair LIO and /LIO is pre-charged by the local I/O line pre-charge circuit 30, data on the bit line pair BL and /BL may be communicated to the local line pair LIO and /LIO in response to activation of the column selection signal CSL (e.g., a transition from a first logic level (a "low") to a second logic level (a "high")).

As illustrated in FIG. 2, the local I/O line pre-charge circuit 30 may include a plurality of N-type (or channel) MOS transistors 31, 32, and 33. The operation of the plurality of N-type MOS transistors 31, 32, and 33 may be controlled by the first pre-charge control signal PRE-1.

In some additional detail, when the first pre-charge control signal PRE-1 is low, each of the N-type MOS transistors 31, 32 and 33 is turned OFF so that a pre-charge operation is not performed. Similarly, when the first pre-charge control signal PRE-1 is high each of the N-type MOS transistors 31, 32 and 33 is turned ON, so that one-half VDD is supplied to the local line pair LIO and /LIO. Therefore, the local line pair LIO and /LIO may be pre-charged to one-half VDD.

Thereafter, the local sensing amplifier circuit 40 senses and amplifies the data on the local line pair LIO and /LIO a second time. That is, the local sensing amplifier circuit 40 connected between the local line pair LIO and /LIO may sense and amplify data of the local line pair LIO and /LIO in response to a local sensing amplifier enable signal LSAEN.

As illustrated in FIG. 3, when the local sensing amplifier enable signal LSAEN transitions from low to high, operation of the local sensing amplifier circuit 40 is enabled, and a first read control signal READ is activated accordingly.

The local sensing amplification circuit 40 of FIG. 2 may include a pull-up circuit 50 configured to pull-up one of the global line pair GIO and /GIO pre-charged to one-half VDD in response to the first read control signal READ or its complement /READ (hereafter, a "second read control signal").

The pull-up circuit 50 may include a plurality of P-type MOS transistors 51 and 52 controlled by the second read control signal /READ, and each of the P-type (or channel) MOS transistors 51 and 52 may be connected to each of the global line pair GIO and /GIO. Each of the plurality of P-type MOS transistors 51 and 52 may be connected to each of a plurality of N-type MOS transistors 44 and 45.

It will now be assumed that the data being communicated via the local line LIO is high, and that the data being communicated via the complementary local line /LIO is low. Given this working assumption, a sensing/amplification operation performed by the local sensing amplifier circuit 40 will be explained.

During a read operation, when the first read control signal READ is activated in response to a command provided (e.g.,) from a host or memory controller (not shown) controlling the operation of the semiconductor memory device 1. N-type MOS transistors 44 and 45 are turned ON by the activated first read control signal READ.

Here, before the read operation is performed, the global line pair GIO and /GIO have been pre-charged to one-half VDD by the global I/O line pre-charge circuit 60. Accordingly, when a write control signal WRITE is activated substantially at the same time as the first read control signal READ is activated, the local line pair LIO and /LIO and the global line pair GIO and /GIO are connected to each other.

It should be noted at this point the signal "activation" in the foregoing description is illustrated as a signal transition from low to high (or a low-high pulse). Those skilled in the art will recognize that this is merely one example of many possible signal activations that might be used in embodiments of the inventive concept. Further, the relative durations of the illustrated control signals of FIG. 3 are merely illustrative.

When high data is communicated via a local line LIO and low data is communicated via the complementary local line /LIO, a first signal path including the plurality of transistors 41, 43, 45 and 51 is enabled, and a second signal path including the plurality of transistors 41, 42, 44 and 52 is disabled by the activated first read control signal READ.

The voltage apparent on one (e.g., GIO) of the global line pair GIO and /GIO that has been pre-charged to one-half VDD is now pulled-down to ground by the first signal path, and the voltage apparent on the other (e.g., /GIO) of the global line pair GIO and /GIO is pulled-up to full VDD by the pull-up circuit 50.

As a result, the difference between the voltages apparent on the global line pair GIO and /GIO supplied to the I/O sensing amplification circuit 90 gets larger than conventionally provided and sensing efficiency for the I/O sensing amplifier circuit 90, which has also been pre-charged to one-half VDD is maximized.

The semiconductor memory device 1 of FIG. 2 may further comprise a write driver 100 configured to supply "write data" (i.e., data to be written to the memory cell array during a write operation) to the global line pair GIO and /GIO. For example, the write driver 100 may communicate write data to the global line pair GIO and /GIO in response to a write enable signal WE.

The semiconductor memory device 1 of FIG. 2 further comprises a bank selection circuit 70 connected across the global line pair GIO and /GIO and disposed between a global I/O line pre-charge circuit 60 and the I/O sensing amplifier circuit 90. The bank selection circuit 70 operates in response to a bank selection signal BKSEL. In the illustrated embodiment, the bank selection circuit 70 comprises P-type (or channel) MOS transistors 71 and 72 performing a switching operation according to the bank selection signal BKSEL.

The semiconductor memory device 1 of FIG. 2 also further comprises a third pre-charge circuit 80 configured to pre-charge the sensed/amplified global line pair SGIO and /SGIO to one-half VDD in response to a third pre-charge control signal PRE-3. In the illustrated embodiment, the third pre-charge circuit 80 comprises N-type (or channel) MOS transistors 81, 82 and 83 performing a switching operation according to the third pre-charge control signal PRE-3.

An exemplary write operation will now be explained. The write driver 100 communicates write data to the global line pair GIO and /GIO in response to the write enable signal WE. Data apparent on the global line pair GIO and /GIO is then communicated to the local line pair LIO and /LIO through MOS transistors 46 and 47 operating in response to the write control signal WRITE. By operation of the column selection circuit 20 in response to the column selection signal CSL, the data apparent on the local line pair LIO and /LIO is communicated to the bit line pair BL and /BL through the bit line sensing amplification circuit 10 and written to a selected memory cell.

Once data has been written to the selected memory cell, the local line pair LIO and /LIO, and the global line pair GIO and /GIO are respectively pre-charged to one-half VDD by each pre-charge circuit 30 and 60. In addition, when a second pre-charge control signal PRE-2 is activated when the bank selection circuit 70 is disabled in response to the bank selection signal BKSEL, each of a plurality of N-type MOS transistors 61, 62 and 63 is turned ON in response to the activated second pre-charge control signal PRE-2. Accordingly, the global line pair GIO and /GIO may be pre-charged to one-half VDD. Each of N-type MOS transistors 81, 82 and 83 is turned ON in response to the activated third pre-charge control signal PRE-3, such that the I/O lines between the bank selection circuit 70 and the I/O sensing amplifier circuit 90 may be pre-charged to one-half VDD.

Figure 4A:
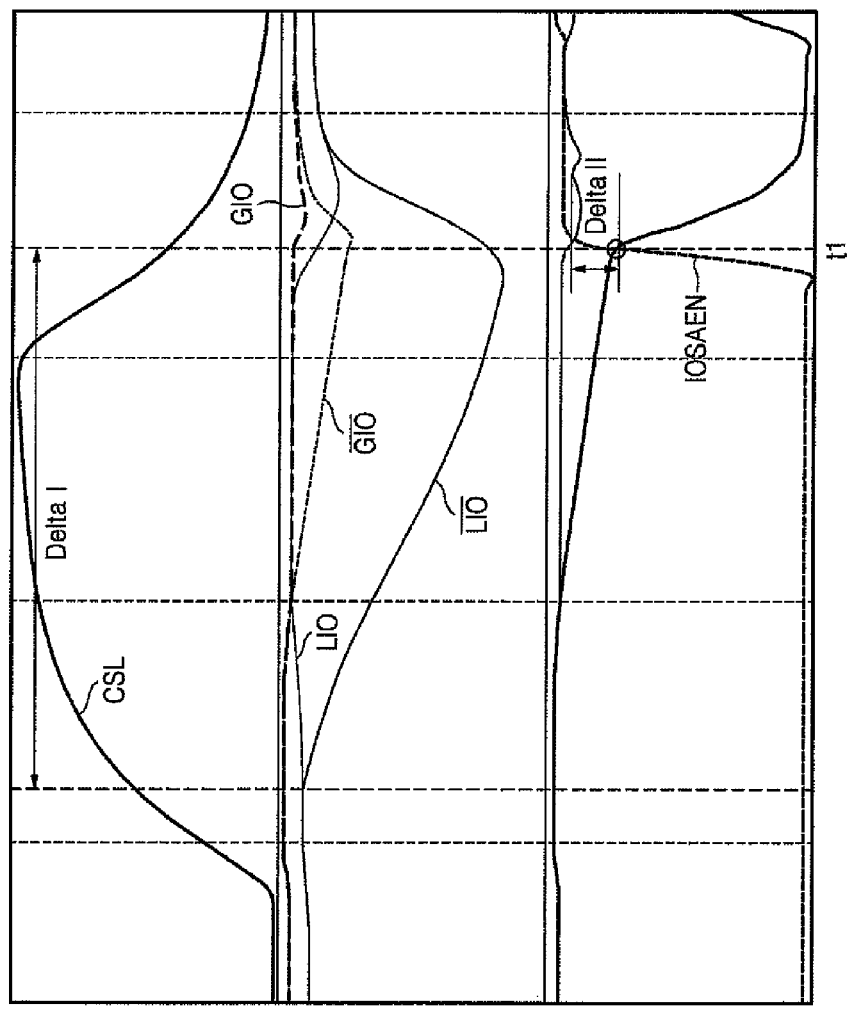
FIG. 4A is a simulation waveform diagram illustrating a sense property during a pre-charge operation using a full-level, as is conventional.
Figure 4B:
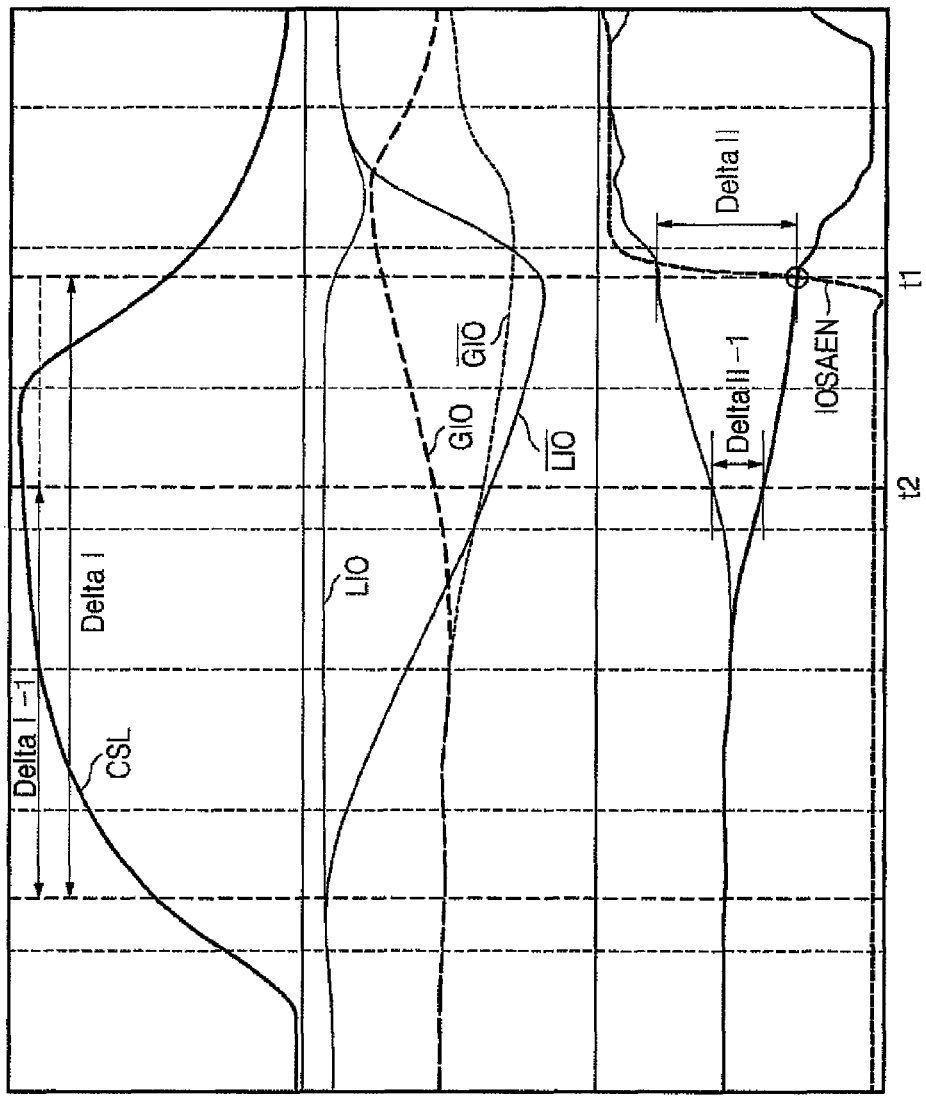
FIG. 4B is a simulation waveform diagram illustrating a sense property during a pre-charge operation using a half-level according to an embodiment of the inventive concept.

FIG. 4A is a simulation waveform diagram showing a sensing property during full level pre-charging as is conventional, and FIG. 4B is a comparative simulation waveform diagram showing a sensing property during a one-half VDD pre-charging according to an embodiment of the inventive concept.

Referring to FIGS. 1 to 4B, the column selection signal CSL control the operation of the plurality of transistors communicating a sense/amplification result from the bit line sensing amplifier circuit 10 to the local line pair LIO and /LIO. Additionally, an I/O sense/amplification enable signal IOSAEN enables the sense/amplification operation performed by the I/O sensing amplifier circuit 90.

Referring to FIGS. 4A and 4B, the illustrated timing margin interval Delta I, which indicates the interval between the time when the column selection signal CSL reaches a specific voltage and the time when the I/O sense/amplification enable signal IOSAEN reaches a specific voltage, is similar. However, the one-half VDD pre-charge method according to an embodiment of the inventive concept, the result of which are shown in FIG. 4B, provides much larger voltage difference, as compared to a conventional full VDD pre-charge method, the result of which is shown in FIG. 4A. That is, the voltage difference "Delta II" between the respective voltages apparent at the global line pair GIO and /GIO at a time "t1" when the I/O sensing amplifier circuit 90 is enabled is notable. Thus, as illustrated by these simulation results, the one-half VDD pre-charge method provides a voltage difference about 2.6 times greater than the conventional full VDD pre-charge method.

Of further note, a voltage difference Delta II at a time t1 illustrated in FIG. 4A is substantially the same as a voltage difference Delta II-1 at a time t2 illustrated in FIG. 4B. Accordingly, the timing margin interval Delta I illustrated in FIG. 4A may be reduced to a timing margin interval Delta I-1 illustrated in FIG. 4B and still obtain similar sense/amplification conditions.

Thus, the timing margin interval Delta I-1 associated with the one-half VDD pre-charge method may be much less than the timing margin interval Delta I required by the conventional full VDD pre-charge method—by as much as about 30%. So, the time required for the semiconductor memory devices according to embodiments of the inventive concept to output data after receiving a read command initiating a read operation is much decreased over the conventional devices.

When a semiconductor memory device does not include a pull-up circuit, such as the one illustrated in FIG. 2, the voltage level apparent on one of the global line pair is decreased and a voltage level apparent on the other remains at one-half VDD, so that there is a very real limit placed on securing a greater difference between voltages of the global line pair at an enable time point of the I/O sensing amplifier circuit.

However, since embodiments of the inventive concept provide semiconductor memory devices comprising a pull-up circuit (e.g., the pull-up circuit 50 of FIG. 2), a voltage level apparent on one of the global line pair GIO and /GIO is decreased at the same time a voltage level apparent on the other is increased during the sense/amplification operation of the local sensing amplifier circuit 40. Accordingly, the difference between voltages apparent on the global line pair GIO and /GIO is much increased at an enable time point of the I/O sensing amplifier circuit 90.

Figure 5:
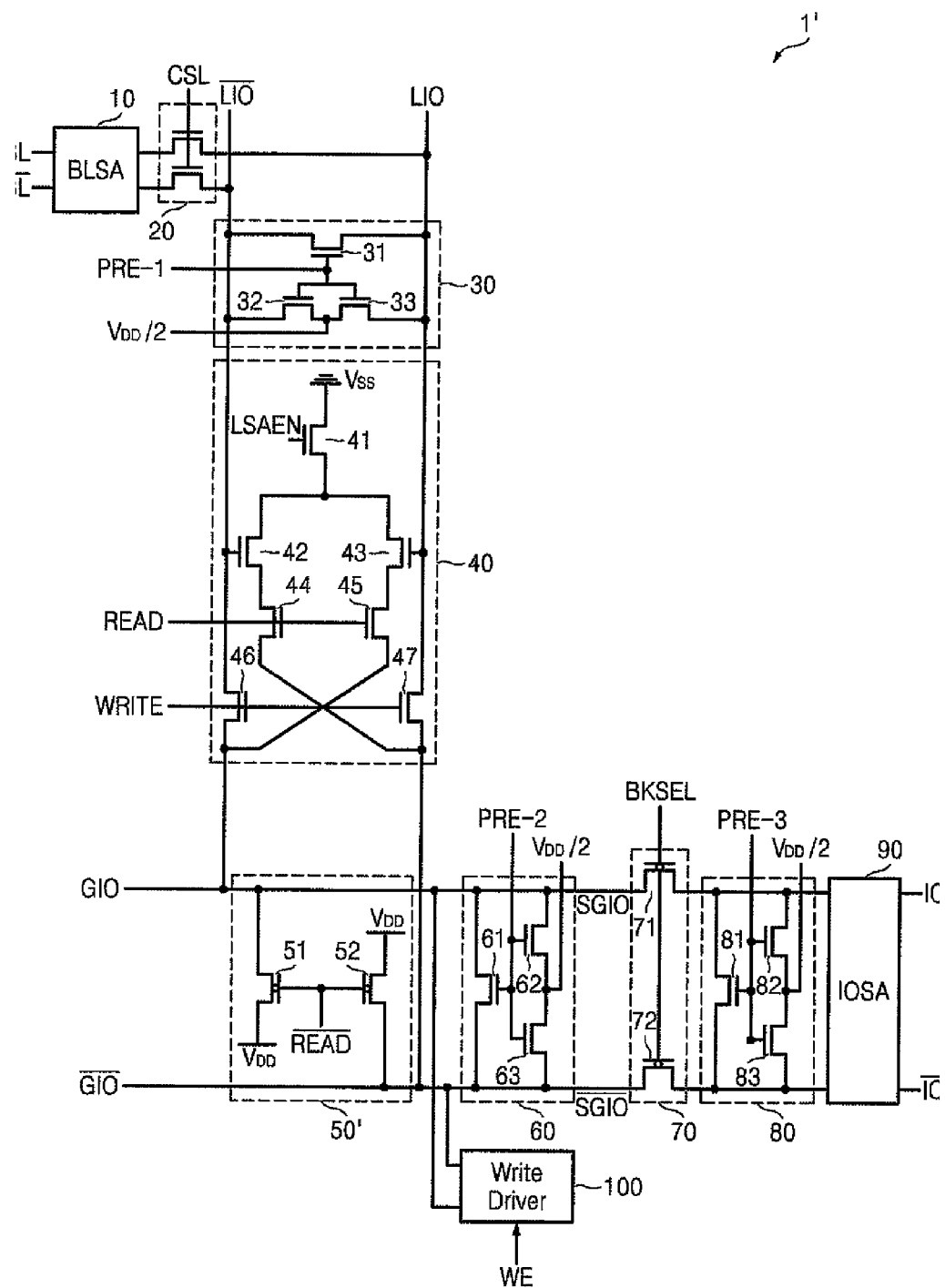
FIG. 5 is a circuit diagram further illustrating the semiconductor memory device of FIG. 1 according to another embodiment of the inventive concept.

FIG. 5 is circuit diagram further illustrating the semiconductor memory device 1' of FIG. 1 according to another embodiment of the inventive concept. Referring to FIGS. 1 through 3 and 5, the pull-up circuit 50 is not disposed within the local sensing amplification circuit 40 as shown in FIG. 2. Instead, a pull-up circuit 50' is disposed between the global line pair GIO and /GIO outside the local sensing amplification circuit 40. Except for this location change for the pull-up circuit 50', the remaining elements of the semiconductor memory device 1' are arranged and operate in a manner substantially the same as analogous elements previously described with respect to FIG. 2. Accordingly, a repetitious detailed description of these common elements will be omitted here.

When the global line pair and the local line pair are pre-charged to a full power voltage level, a high level voltage apparent on a bit line does not suffer any ill effect during subsequent sensing/amplification. But this is not the case for a low level voltage apparent on a bit line. This bit line sensing mismatch within a sense amplifier circuit causes data sensing errors.

However, by pre-charging the global line pair GIO and /GIO and the local line pair LIO and /LIO to a one-half power voltage level (e.g., VDD/2) according to the inventive concept, uniform sensing conditions may be achieved for both high level and low level data signals apparent on a bit line. Thus, data sensing errors may be effectively prevented.

FIGS. 6A through 6D shows various arrangement examples for the disposition of a pull-up circuit according to certain embodiments of the inventive concept. Referring to FIGS. 1 to 6D, the semiconductor memory device 1 or 1' comprises a pull-up circuit 50 capable of performing a push-pull operation to maximize sensing efficiency using a one-half power supply level pre-charge method. As illustrated in FIGS. 6A through 6D, the pull-up circuit 50 may be variously disposed in its location.

Figure 6B:
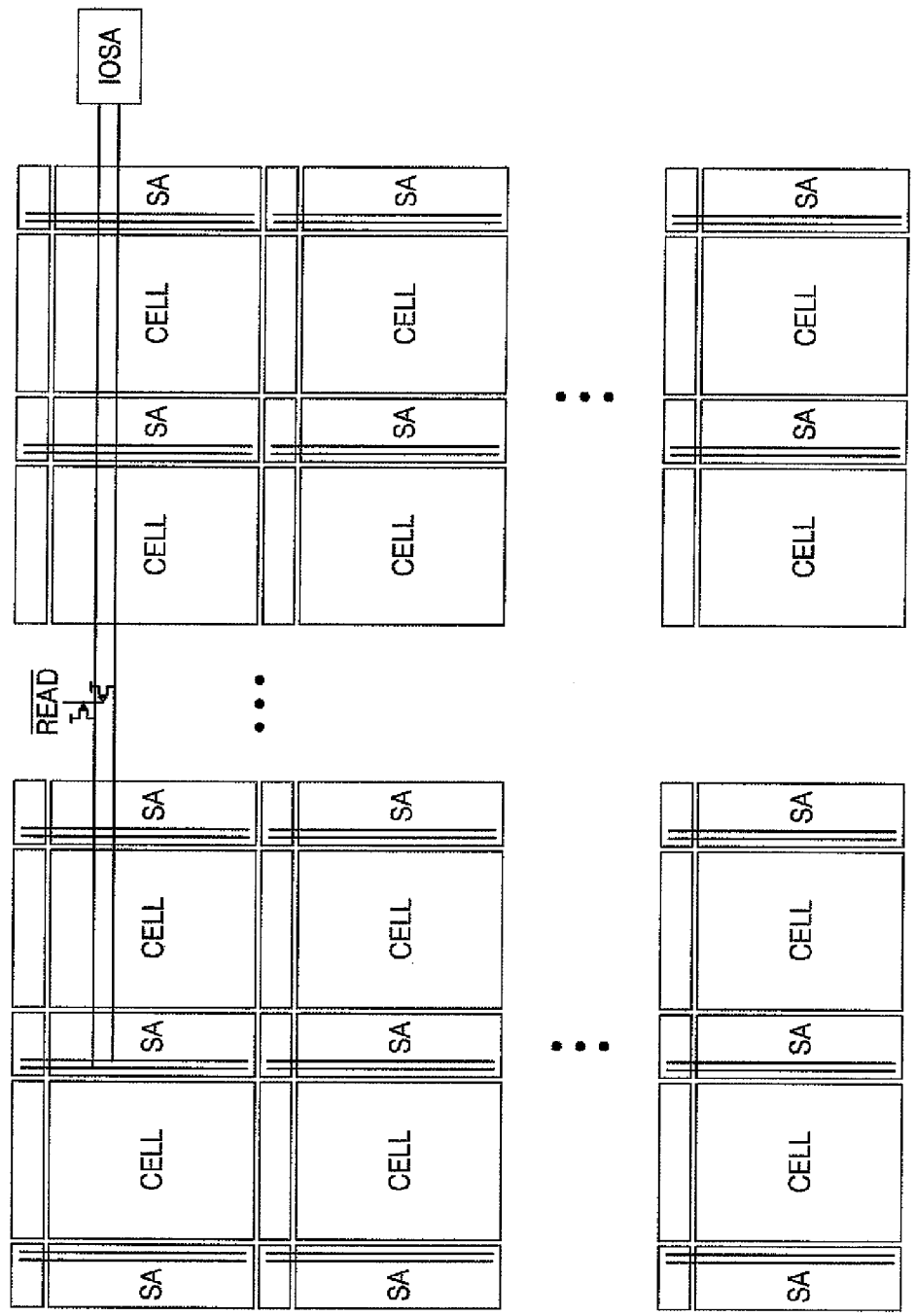
Figure 6C:
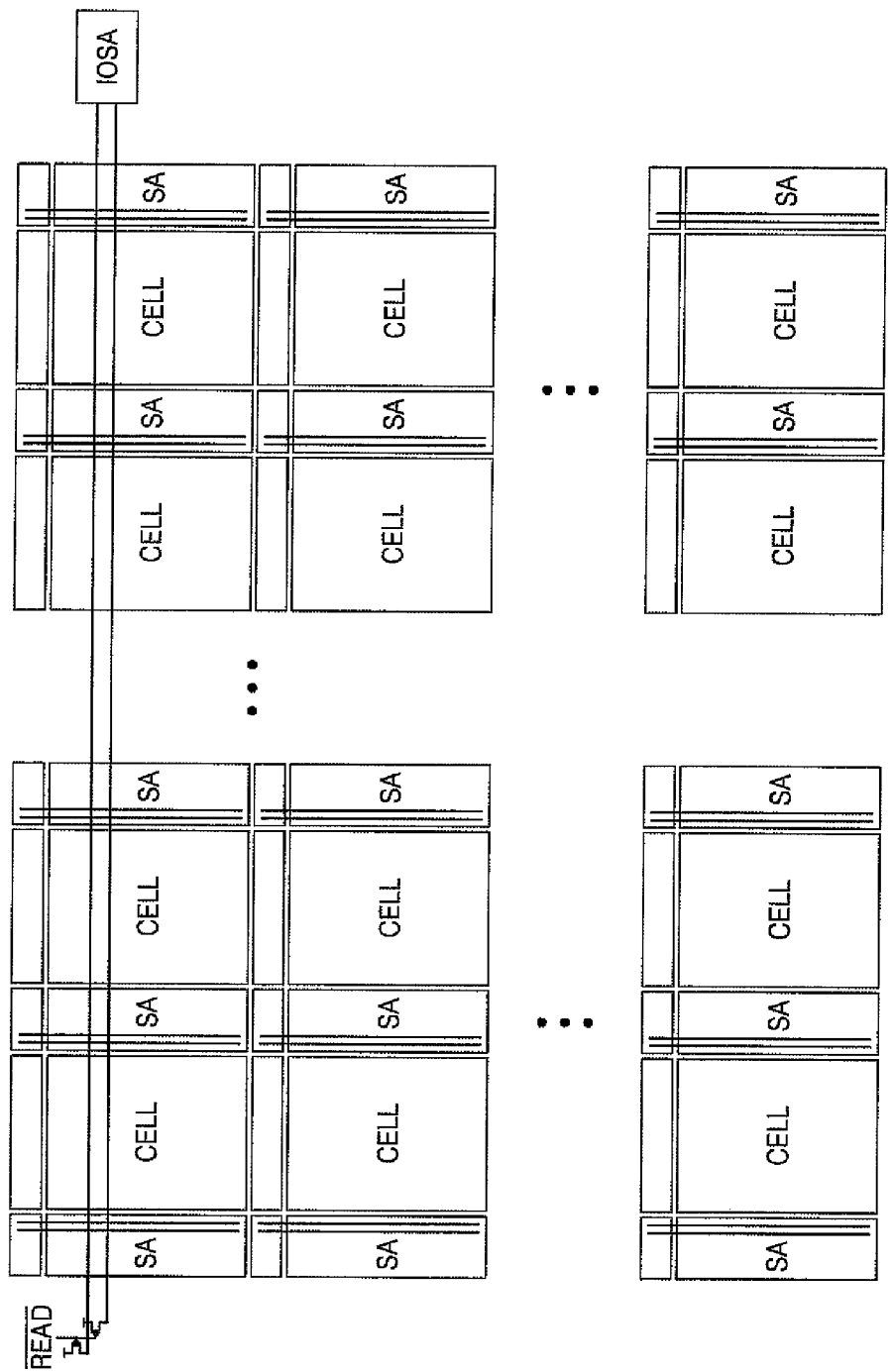
Figure 6D:
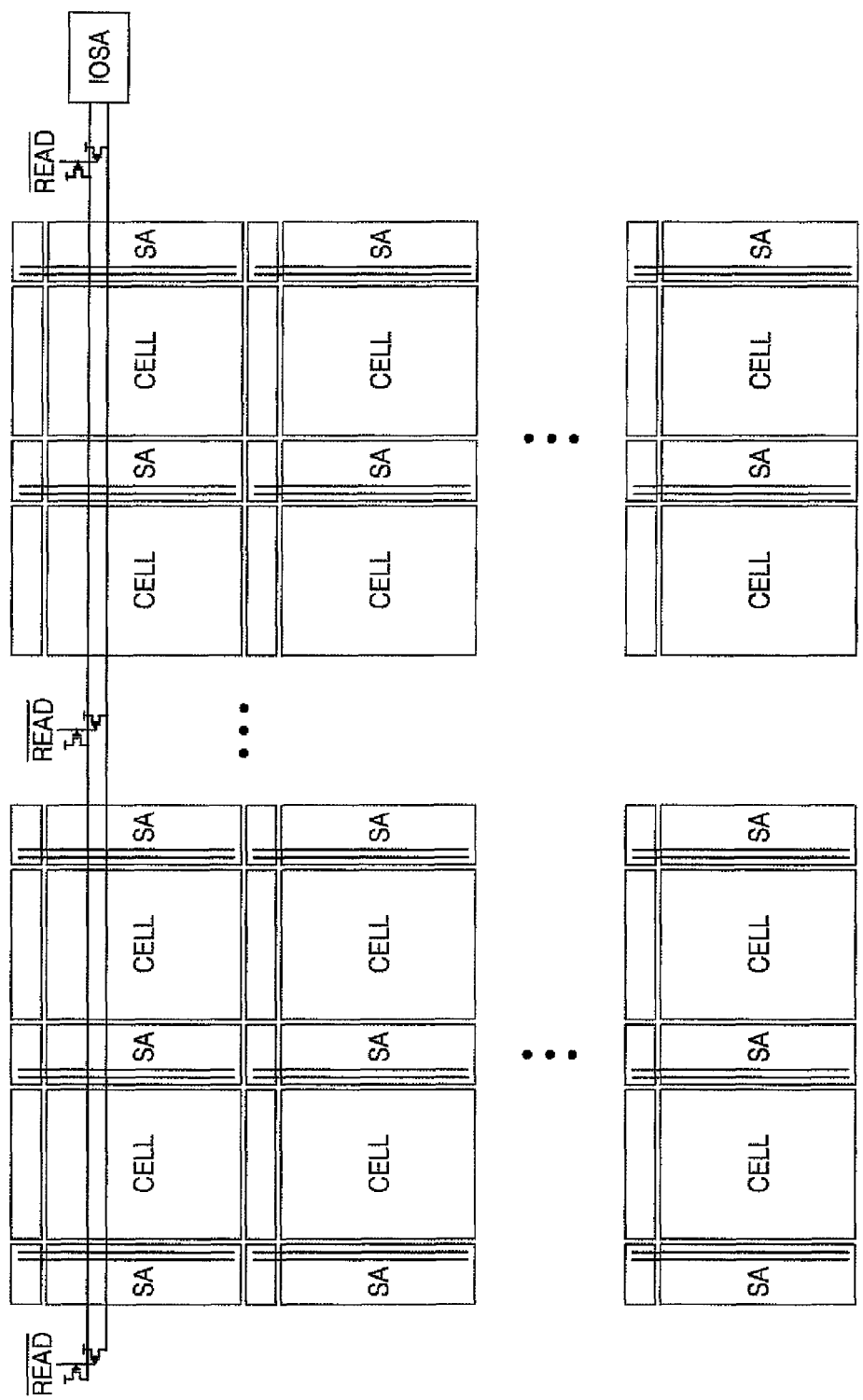

The pull-up circuit may be arranged inside of the local sensing amplifier circuit 40 as illustrated in FIG. 6A or may be arranged between the global line pair GIO and /GIO as illustrated in FIG. 6B. The pull-up circuit may also be arranged at an edge of the global line pair GIO and /GIO as illustrated in FIG. 6C or arranged between the global line pair GIO and /GIO as illustrated in FIG. 6D.

The semiconductor memory device according to an embodiment of the inventive concept maximizes sensing efficiency for a sensing amplifier circuit pre-charged to a one-half power voltage level by adding a pull-up circuit to (e.g.,) the local sensing amplifier circuit to thereby enable a push-pull operation. The semiconductor memory device according to an embodiment of the inventive concept also increases data sensing efficiency for the sensing amplifier circuit by providing uniform sensing conditions between a bit line and a complementary bit line.

Although a several embodiments of the inventive concept have been shown and described, it will be appreciated by those skilled in the art that changes may be made in these embodiments without departing from the principles and scope of the inventive concept, as set forth in the appended claims and their equivalents.

What is claimed is:

1. A semiconductor memory device comprising:
a first input/output (I/O) line pair;
a second I/O line pair pre-charged to a one-half power voltage level and configured to receive data from the first I/O line pair; and
a pull-up circuit configured to pull-up a voltage apparent on one of the second I/O line pair to a full power voltage level in response to a control signal.

2. The semiconductor memory device of claim 1, wherein the first I/O line pair is a local data I/O line pair and the second I/O line pair is a global data I/O line pair.

3. The semiconductor memory device of claim 2, wherein the pull-up circuit comprises:
a plurality of P-type MOS transistors controlled in response to the control signal, wherein each one of the plurality of P-type MOS transistors is connected to one of the global data I/O line pair.

4. The semiconductor memory device of claim 3, wherein each one of the plurality of P-type MOS transistors is connected to one of a plurality of N-type MOS transistors configured to control connection to one of the local data I/O line pair in response to a read signal.

5. The semiconductor memory device of claim 4, wherein the read signal and the control signal are complementary signals.

6. The semiconductor memory device of claim 1, wherein the semiconductor memory device further comprises a local sensing amplification circuit and the pull-up circuit is disposed within the local sensing amplification circuit.

7. The semiconductor memory device of claim 1, wherein the semiconductor memory device further comprises a local sensing amplification circuit and the pull-up circuit is disposed outside the local sensing amplification circuit.

8. The semiconductor memory device of claim 1, further comprising:
a bit line sensing amplifier circuit configured to sense/amplify data apparent on a bit line pair and communicate the data to the first I/O line pair;
a local sensing amplifier circuit pre-charged to the one-half power voltage level and configured to sense/amplify data apparent on the first I/O line pair and communicate the data to the second I/O line pair; and
an I/O sensing amplifier circuit pre-charged to the one-half power voltage level and configured to sense/amplifies data apparent on the second I/O line pair,
wherein at least one of the bit line sensing amplifier circuit, the local sensing amplifier circuit, and the I/O sensing amplifier circuit is latch type.

9. The semiconductor memory device of claim 8, wherein the semiconductor memory device further comprises:
a local I/O equalizer circuit configured to equalize the local sensing amplifier circuit, wherein the local I/O equalizer circuit is pre-charged to a full power voltage level.

10. The semiconductor memory device of claim 8, wherein the semiconductor memory device further comprises:
a local I/O equalizer circuit configured to equalize the local sensing amplifier circuit, wherein the local I/O equalizer circuit is pre-charged to the one-half power voltage level.

11. A semiconductor memory device comprising:
a local line and a complementary local line;
a global line connected to the local line and a complementary global line connected to the complementary local line;
a first pre-charge circuit configured to pre-charge the local line and the complementary local line to a one-half power voltage level during a pre-charge operation;
a second pre-charge circuit configured to pre-charge the global line and the complementary global line to the one-half power voltage level during the pre-charge operation; and a pull-up circuit configured to pull-up a voltage apparent on one of the local line and the complementary local line to a full power voltage level in response to a control signal.

12. The semiconductor memory device of claim 11, wherein the pull-up circuit comprises:
a plurality of P-type MOS transistors controlled in response to the control signal, wherein each one of the plurality of P-type MOS transistors is connected to one of the global data I/O line pair.

13. The semiconductor memory device of claim 12, wherein each one of the plurality of P-type MOS transistors is connected to one of a plurality of N-type MOS transistors configured to control connection to one of the local data I/O line pair in response to a read signal.

14. The semiconductor memory device of claim 13, wherein the read signal and the control signal are complementary signals.

15. The semiconductor memory device of claim 11, wherein the semiconductor memory device further comprises a local sensing amplification circuit and the pull-up circuit is disposed within the local sensing amplification circuit.

16. The semiconductor memory device of claim 11, wherein the semiconductor memory device further comprises a local sensing amplification circuit and the pull-up circuit is disposed outside the local sensing amplification circuit.

17. A method of operating a semiconductor memory device, comprising:
respectively connecting bit lines of a bit line pair with local lines of a local line pair;
precharging the local line pair to a one-half power voltage level;
after pre-charge of the local line pair, communicating data from the bit line pair to the local line pair;
using a local sensing amplifier, sensing/amplifying the data on the local line pair;
precharging a global line pair connected to the local line pair to the one-half power voltage level;
respectively connecting global lines of the global line pair with local lines of the local line pair and communicating the data to the global line pair; and thereafter,
pulling-down a voltage apparent on one global line of the global line pair while pulling-up a voltage apparent on the other global line of the global line pair, and using a global sensing amplifier, sense/amplifying the data on the global line pair.

18. The method of claim 17, wherein the voltage apparent on the one global line of the global line pair is pulled down to ground and the voltage apparent on the other global line of the global line pair is pulled up to a full power voltage level.

19. The method of claim 18, further comprising:
after sense/amplifying the data on the global line pair, precharging the global line pair to the one-half power voltage level; and thereafter,
outputting the data.

20. The method of claim 17, wherein the power voltage is VDD.

* * * * *